(12) United States Patent
Hopkins et al.

(10) Patent No.: US 11,037,797 B2
(45) Date of Patent: Jun. 15, 2021

(54) ARRAYS OF ELEVATIONALLY-EXTENDING STRINGS OF MEMORY CELLS AND METHODS USED IN FORMING AN ARRAY OF ELEVATIONALLY-EXTENDING STRINGS OF MEMORY CELLS

(71) Applicant: Micron Technology, Inc., Boise, ID (US)

(72) Inventors: John D. Hopkins, Meridian, ID (US); Gordon A. Haller, Boise, ID (US); Tom J. John, Boise, ID (US); Anish A. Khandekar, Boise, ID (US); Christopher Larsen, Boise, ID (US); Kunal Shrotri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/854,283

(22) Filed: Apr. 21, 2020

(65) Prior Publication Data

US 2020/0251347 A1 Aug. 6, 2020

Related U.S. Application Data

(62) Division of application No. 16/128,109, filed on Sep. 11, 2018, now Pat. No. 10,665,469.

(51) Int. Cl.
*H01L 21/311* (2006.01)
*H01L 27/11582* (2017.01)
(Continued)

(52) U.S. Cl.
CPC .. *H01L 21/31116* (2013.01); *H01L 21/02178* (2013.01); *H01L 21/31111* (2013.01); *H01L 27/11556* (2013.01); *H01L 27/11582* (2013.01)

(58) Field of Classification Search
CPC ............ H01L 21/8221; H01L 27/0611; H01L 27/0688; H01L 27/11514;
(Continued)

(56) References Cited

U.S. PATENT DOCUMENTS

2015/0279855 A1 10/2015 Lu et al.
2016/0133640 A1 5/2016 Zhu et al.
(Continued)

*Primary Examiner* — Cuong B Nguyen
(74) *Attorney, Agent, or Firm* — Wells St. John P.S.

(57) ABSTRACT

A method used in forming an array of elevationally-extending strings of memory cells comprises forming a stack comprising vertically-alternating insulative tiers and wordline tiers. The stack comprises an etch-stop tier between a first tier and a second tier of the stack. The etch-stop tier is of different composition from those of the insulative tiers and the wordline tiers. Etching is conducted into the insulative tiers and the wordline tiers that are above the etch-stop tier to the etch-stop tier to form channel openings that have individual bases comprising the etch-stop tier. The etch-stop tier is penetrated through to extend individual of the channel openings there-through. After extending the individual channel openings through the etch-stop tier, etching is conducted into and through the insulative tiers and the wordline tiers that are below the etch-stop tier to extend the individual channel openings deeper into the stack below the etch-stop tier. Transistor channel material is formed in the individual channel openings elevationally along the etch-stop tier and along the insulative tiers and the wordline tiers that are above and below the etch-stop tier. Arrays independent of method are disclosed.

27 Claims, 16 Drawing Sheets

(51) Int. Cl.
*H01L 27/11556* (2017.01)
*H01L 21/02* (2006.01)

(58) Field of Classification Search
CPC .......... H01L 27/11507–11536; H01L 27/1151; H01L 27/1156–1158; H01L 27/11597; H01L 27/1203; H01L 27/11548; H01L 27/11558; H01L 27/115; H01L 21/31116; H01L 27/11582; H01L 27/11556; H01L 21/02178; H01L 21/31111
See application file for complete search history.

(56) References Cited

U.S. PATENT DOCUMENTS

| | | |
|---|---|---|
| 2017/0110473 A1 | 4/2017 | Lee |
| 2017/0345843 A1* | 11/2017 | Lee .................. H01L 27/11575 |
| 2018/0366386 A1 | 12/2018 | Petz et al. |

* cited by examiner

ARRAYS OF ELEVATIONALLY-EXTENDING STRINGS OF MEMORY CELLS AND METHODS USED IN FORMING AN ARRAY OF ELEVATIONALLY-EXTENDING STRINGS OF MEMORY CELLS

RELATED PATENT DATA

This patent resulted from a divisional application of U.S. patent application Ser. No. 16/128,109, filed Sep. 11, 2018, entitled "Arrays Of Elevationally-Extending Strings Of Memory Cells And Methods Used In Forming An Array Of Elevationally-Extending Strings Of Memory Cells", naming John D. Hopkins, Gordon A. Haller, Tom J. John, Anish A. Khandekar, Christopher Larsen, and Kunal Shrotri as inventors, the disclosure of which is incorporated by reference.

TECHNICAL FIELD

Embodiments disclosed herein pertain to arrays of elevationally-extending strings of memory cells and to methods used in forming an array of elevationally-extending strings of memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells.

DETAILED DESCRIPTION OF EXAMPLE EMBODIMENTS

The subject matter disclosed herein was developed and the claimed invention herein was made by, or on behalf of, Micron Technology, Inc. and Intel Corporation that were parties to a joint research agreement that was in effect on or before the effective filing date of the claimed invention herein. Embodiments of the invention encompass methods used in forming an array of elevationally-extending strings of transistors and/or memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of elevationally-extending strings of memory cells (e.g., NAND or other memory cells) independent of method of manufacture. First example method embodiments are described with reference to FIGS. 1-12 which may be considered as a "gate-last" or "replacement-gate" process.

Figure 1:
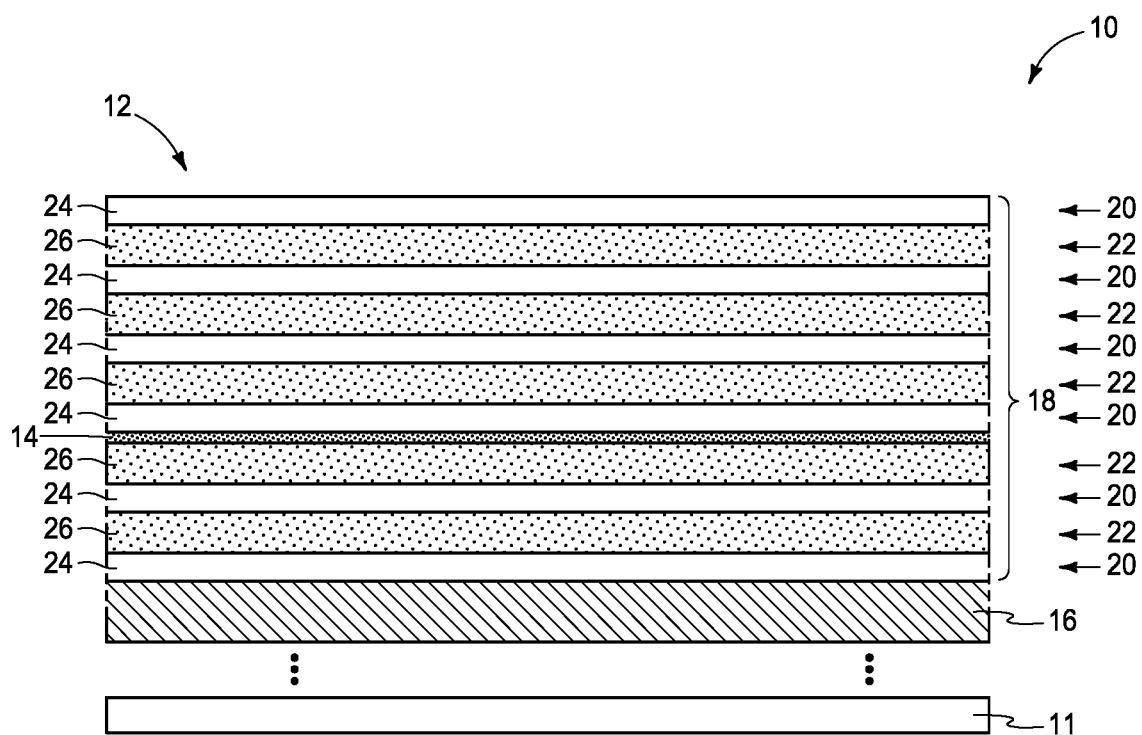
FIG. 1 is a diagrammatic cross-sectional view of a portion of a substrate in process in accordance with an embodiment of the invention.

FIG. 1 shows a substrate construction 10 in process of a method of forming an array 12 of elevationally-extending strings of transistors and/or memory cells. Substrate construction 10 comprises a base substrate 11 having any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIG. 1—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate construction 10 comprises a stack 18 comprising vertically-alternating insulative tiers 20 and wordline tiers 22 directly above an example conductively-doped semiconductor material 16 (e.g., conductively-doped polysilicon). Conductive material 16 may comprise a part of control circuitry (e.g., peripheral-under-array circuitry) used to control read and write access to the transistors and/or memory cells that will be formed within array 12. Insulative tiers 20 comprise insulative first material 24 (e.g., silicon dioxide). Wordline tiers 22 comprise second material 26 that is of different composition from that of first material 24 (e.g., silicon nitride, and regardless which may be wholly or partially sacrificial). Only a small number of tiers 20 and 22 is shown, with more likely stack 18 comprising dozens, a hundred or more, etc. of tiers 20 and 22.

Stack 18 comprises an etch-stop tier 14 between a top tier 20 or 22 and a bottom tier 20 or 22 (e.g., a first tier and a second tier) of stack 18, and that is of different composition from those of insulative tiers 20 and wordline tiers 22. Etch-stop tier 14 may be of the same or different elevational thickness as any one or more of insulative tiers 20 and/or wordline tiers 22. The etch-stop tier may be one of insulative tiers 20 (e.g., one of insulative tiers 20 being composed entirely of etch-stop material as described below, and not shown,). The etch-stop tier may be one of wordline tiers 22 (not shown), for example an entirety of which is composed of etch-stop material as described below, for example as may occur in a gate-last or replacement gate process. Regardless, in one embodiment the etch-stop tier is insulative. In one embodiment, the etch-stop tier is conductive. In one embodiment, the etch-stop tier comprises an oxide comprising at least one of Mg and Hf (e.g., $Mg_xO_y$, $Hf_xO_y$, $Mg_xHf_yO_z$, oxides having one or more metals in addition to at least one of Mg and Hf etc., and which may or may not be stoichiometric), in one such embodiment comprises Al (e.g., $Al_wMg_xHf_yO_z$, $Al_xMg_yO_z$, $Al_xHf_yO_z$, etc., and which may or may not be stoichiometric), and in one such embodiment comprises Si (e.g., $Si_xMg_yO_z$, $Si_xHf_yO_z$, $Si_wMg_xHf_yO_z$, $Si_wAl_xMg_yO_z$, $Si_wAl_xHf_yO_z$, $Si_vAl_wMg_xHf_yO_z$, etc., and which may or may not be stoichiometric).

Figure 2:
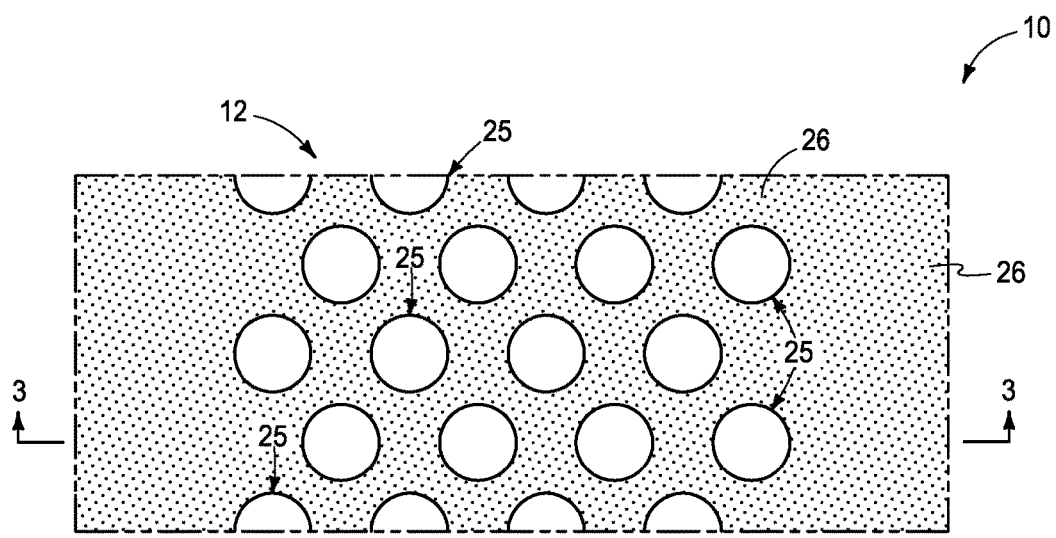
FIG. 2 is a view of the FIG. 1 substrate at a processing step subsequent to that shown by FIG. 1 and is taken through line 2-2 in FIG. 3.
Figure 3:
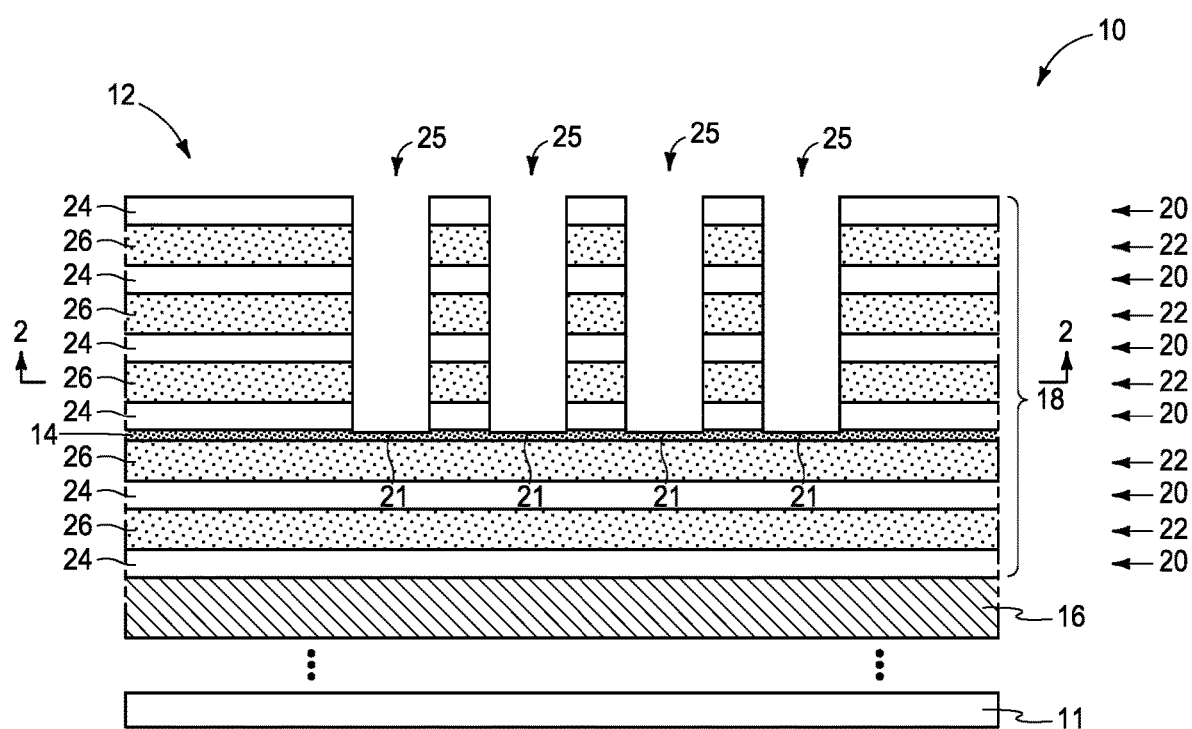
FIG. 3 is a view taken through line 3-3 in FIG. 2.

Referring to FIGS. 2 and 3, etching has been conducted into insulative tiers 20 and wordline tiers 22 that are above etch-stop tier 14 to etch-stop tier 14 to form channel openings 25 that have individual bases 21 comprising etch-stop tier 14. In one embodiment and as shown, the etching to etch-stop tier 14 over-etches partially into etch-stop tier 14, and in one embodiment and as shown over-etches into less than half of vertical thickness of etch-stop tier 14. Etching partially into etch-stop layer 14 may improve critical dimension control of the channel openings, and which may be facilitated by creating a more square (right angle) between the sidewalls and bases of the channel openings. Such may also control (reduce) undesired radially inward tapering of the channel openings deeper in the stack. Regardless, and by way of example only, channel openings 25 are shown as being arranged in groups or columns of staggered rows of four openings 25 per row. Any alternate existing or future-developed arrangement and construction may be used. Use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles. Other circuitry that may or may not be part of peripheral circuitry may be between conductively-doped semiconductor material 16 and stack 18.

Figure 4:
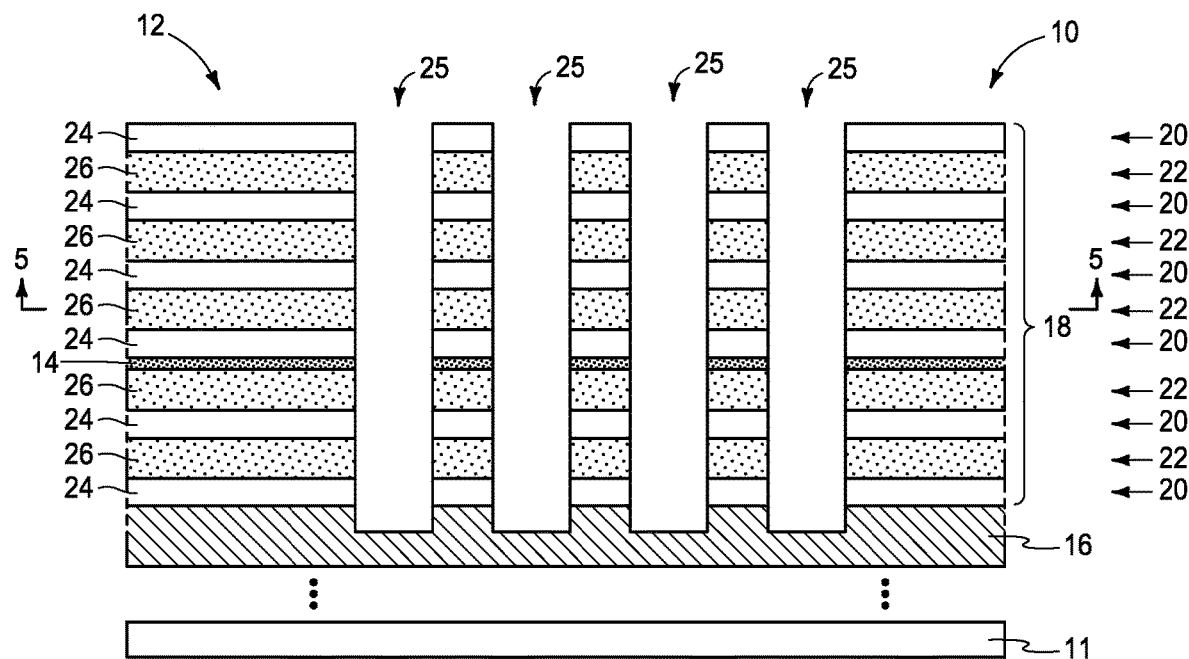
FIG. 4 is a view of the FIG. 3 substrate at a processing step subsequent to that shown by FIG. 3.

Referring to FIG. 4, etch-stop tier 14 has been penetrated through to extend individual channel openings 25 therethrough. Thereafter, etching has been conducted into and through insulative tiers 20 and wordline tiers 22 that are below etch-stop tier 14 to extend individual channel openings 25 deeper into stack 18 below etch-stop tier 14. Example methods of penetrating through etch-stop tier 14 include one or both of dry anisotropic etching or wet etching of etch-stop tier 14. Such etching may be conducted selectively relative to materials 24 and 26, for example as shown. The artisan will be able to select one or more suitable etching chemistries depending on composition of the material of etch-stop tier 14 and in comparison to compositions of materials 24 and 26 depending on desired selectivity (if any) of the etching when materials 24 and 26 are exposed. As an example, where materials/tier 24, 26, and 14 are silicon dioxide, silicon nitride, and $Mg_xHf_yO_z$, respectively, a dry chemistry for etching tier 14 selectively relative to materials 24 and 26 is $Cl_2$ and a wet chemistry is a mixture of an hydroxide and ammonia. The greater the quantity of Hf in $Mg_xHf_yO_z$ typically the slower the etch rate with $Cl_2$ and a mixture of hydroxide and ammonia as well as lower selectivity relative to silicon dioxide and/or silicon nitride.

Stack 18 is shown as comprising only a single etch-stop tier 14. Alternately, more than one etch-stop tier may be used in a single stack (e.g., vertically spaced from one another), with etching of channel openings 25 stopping atop or within the respective etch-stop tier before etching there-through and there-below to a next-lower etch-stop tier.

Transistor channel material is ultimately formed in the individual channel openings elevationally along the etch-stop tier and along the insulative tiers and the wordline tiers that are above and below the etch-stop tier. Further, the wordline tiers are provided to comprise control-gate material having terminal ends corresponding to control-gate regions of individual memory cells. Charge-storage material (e.g., floating gate material such as doped or undoped silicon or charge-trapping material such as silicon nitride, metal dots, etc.) is provided between the transistor channel material and the control-gate regions. Insulative charge-passage material (e.g., a bandgap-engineered structure having nitrogen containing material [e.g., silicon nitride] sandwiched between two insulator oxides [e.g., silicon dioxide] is provided between the transistor channel material and the charge-storage material, and a charge-blocking region is provided between the charge-storage material and individual of the control-gate regions.

Figure 5:
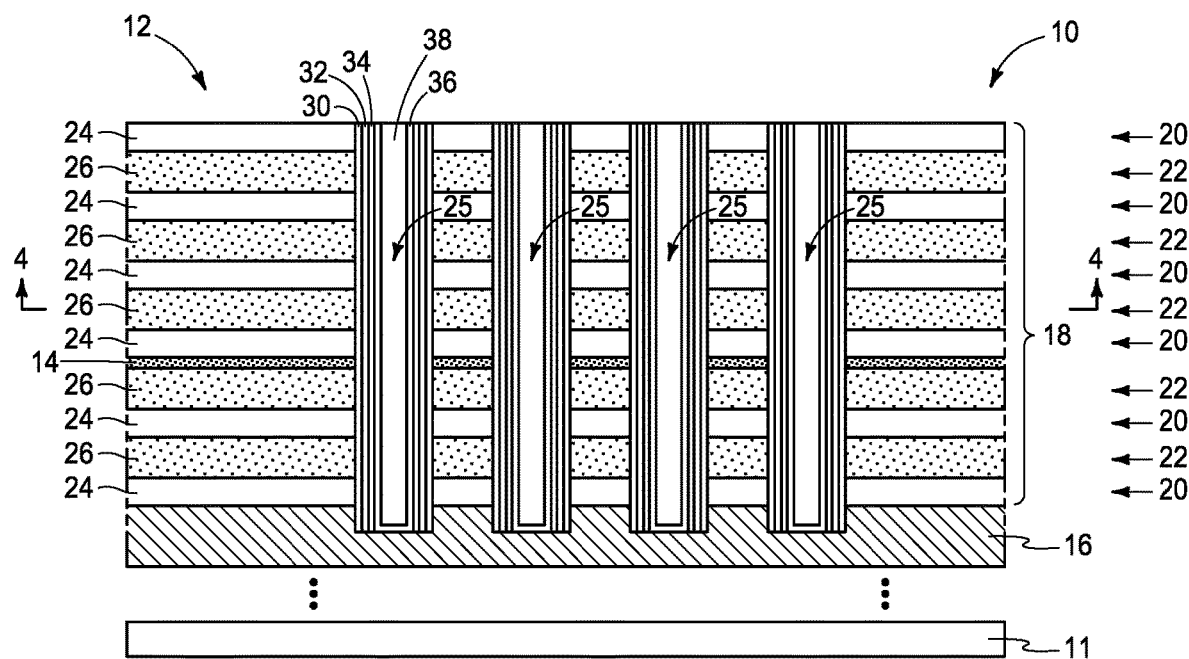
FIG. 5 is a view of the FIG. 4 substrate at a processing step subsequent to that shown by FIG. 4.

FIG. 5 shows one embodiment wherein charge-blocking material 30, charge-storage material 32, and charge-passage material 34 have been formed in individual channel openings 25 elevationally along etch-stop tier 14 and along insulative tiers 20 and wordline tiers 22 that are above and below etch-stop tier 14. Transistor materials 30, 32 and 34 may be formed by, for example, deposition of respective thin layers thereof over stack 18 and within individual lower channel openings 25 followed by planarizing such back at least to an elevationally-outermost surface of stack 18. Transistor channel material 36 has then been formed in individual channel openings 25 elevationally along etch-stop tier 14 and along insulative tiers 20 and wordline tiers 22 that are above and below etch-stop tier 14. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 are 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 6:
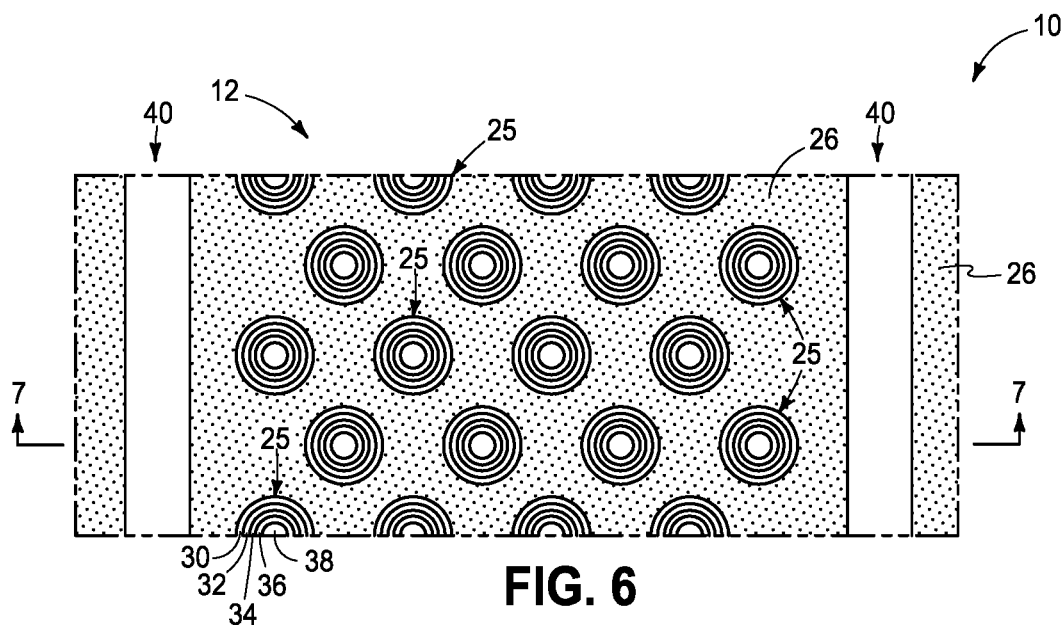
FIG. 6 is a view of the FIG. 5 substrate at a processing step subsequent to that shown by FIG. 5 and is taken through line 6-6 in FIG. 7.
Figure 7:
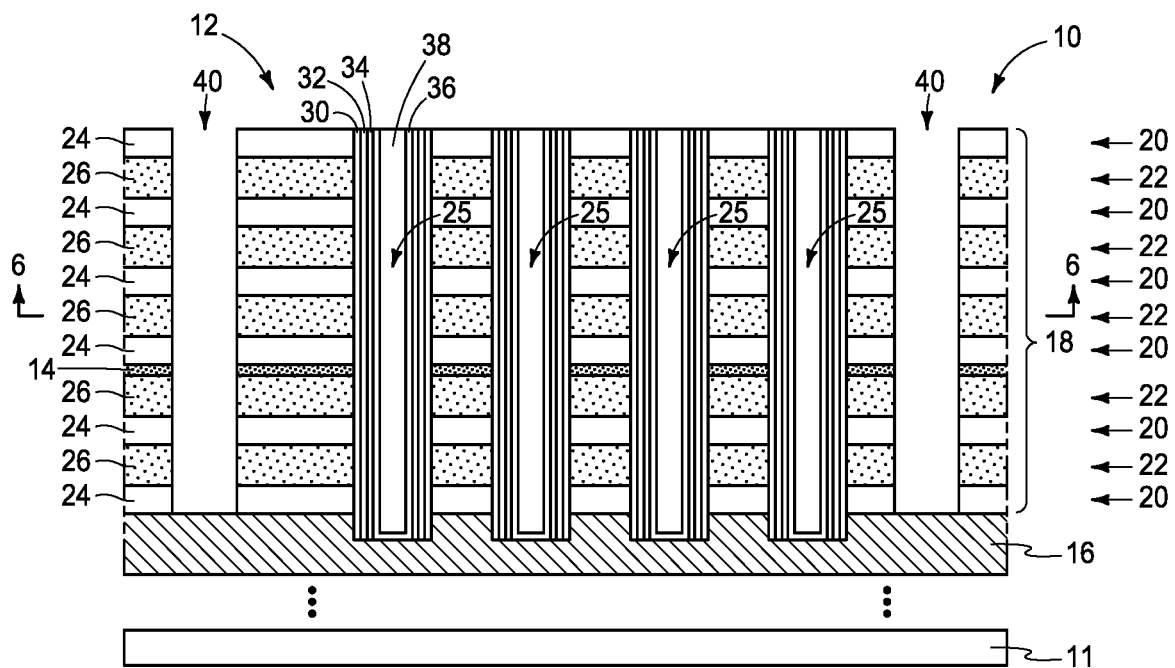
FIG. 7 is a view taken through line 7-7 in FIG. 6.

Referring to FIGS. 6 and 7, horizontally-elongated (FIG. 6) trenches 40 have been formed (e.g., by anisotropic etching) into stack 18 and in one embodiment to conductively-doped semiconductor material 16 (i.e., at least to material 16). Lateral edges of trenches 40 may at least in part be used to define lateral edges of wordlines (e.g., access or control-gate lines, and not shown in FIGS. 6 and 7) to be formed subsequently as described below.

Figure 8:
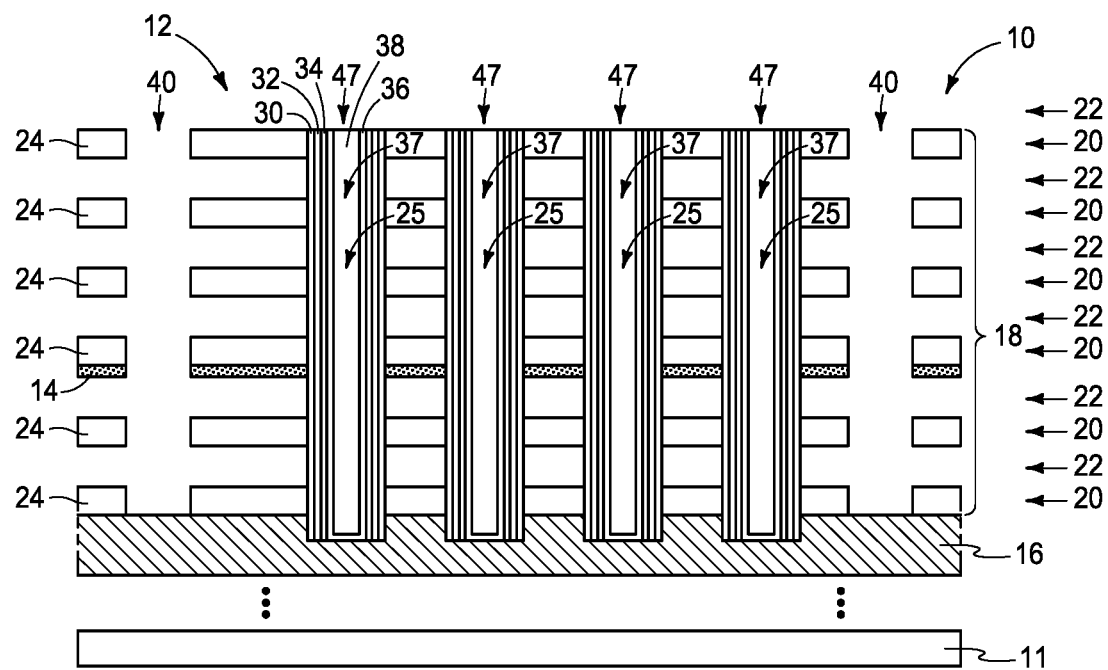
FIG. 8 is a view of the FIG. 7 substrate at a processing step subsequent to that shown by FIG. 7.

Referring to FIG. 8, second material 26 (not shown) of wordline tiers 22 has been etched selectively relative to insulative first material 24 (and in one embodiment as shown selectively relative to etch-stop material 14). An example etching chemistry, where second material 26 comprises silicon nitride, first material 24 comprises silicon dioxide, and etch-stop material 14 comprises an oxide comprising at least one of Mg and Hf, is liquid or vapor etching with $H_3PO_4$ as a primary etchant.

Figure 9:
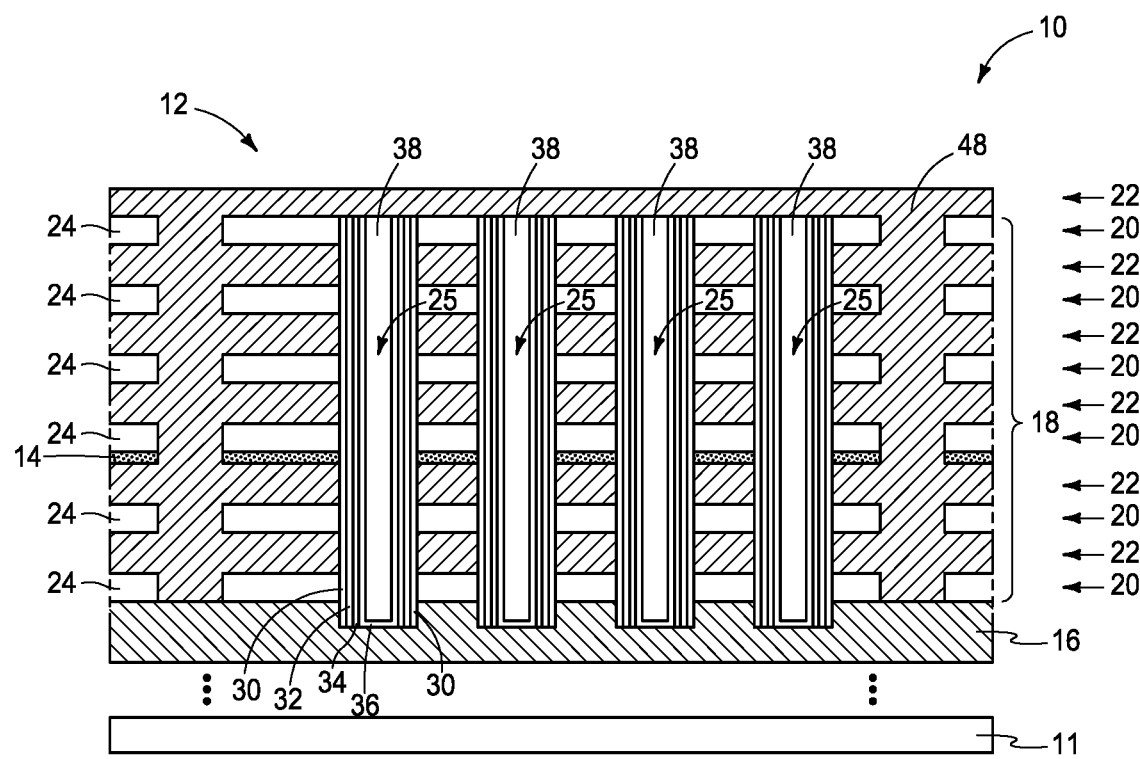
FIG. 9 is a view of the FIG. 8 substrate at a processing step subsequent to that shown by FIG. 8.

Referring to FIG. 9, control-gate material 48 (i.e., conductive material) has been formed into wordline tiers 22 through trenches 40 to be elevationally between insulative first material 24. Any suitable conductive material may be used, for example one or both of metal material and/or conductively-doped semiconductor material.

Figure 10:
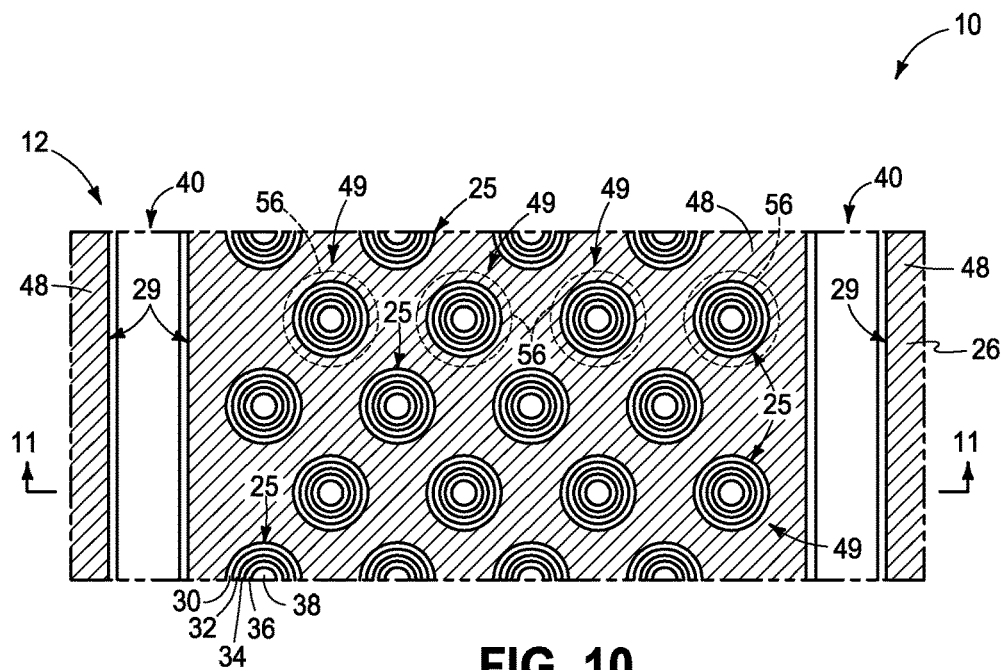
FIG. 10 is a view of the FIG. 9 substrate at a processing step subsequent to that shown by FIG. 9 and is taken through line 10-10 in FIG. 11.
Figure 11:
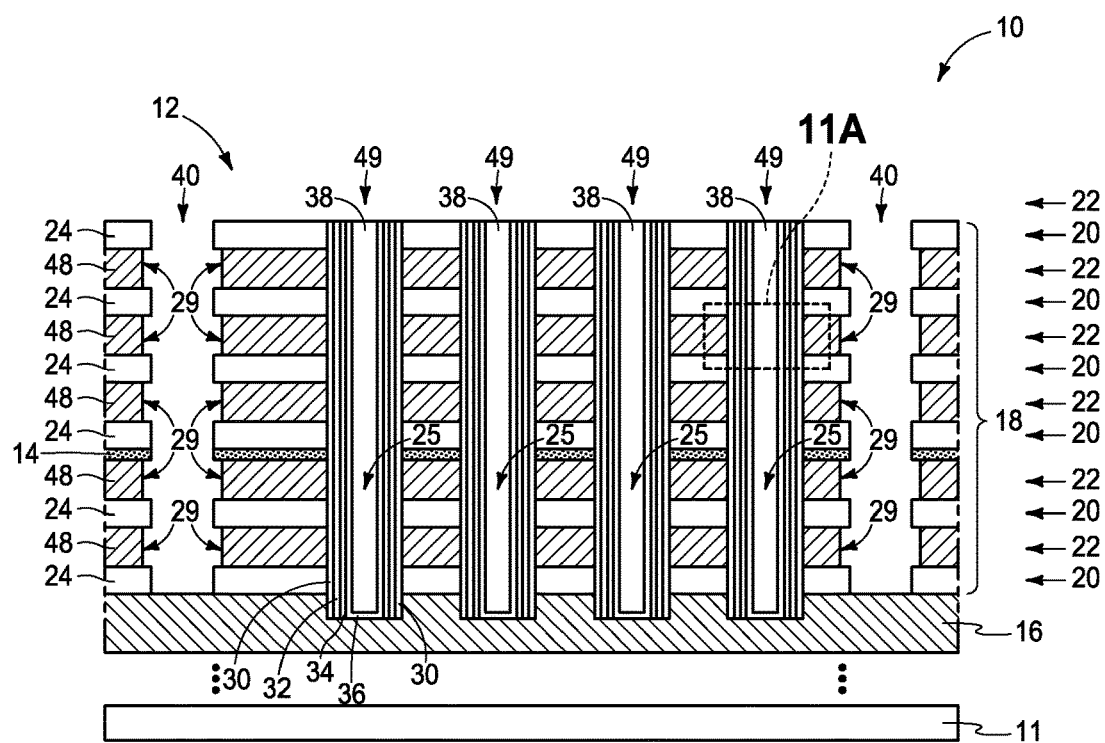
FIG. 11 is a view taken through line 11-11 in FIG. 10.
Figure 11A:
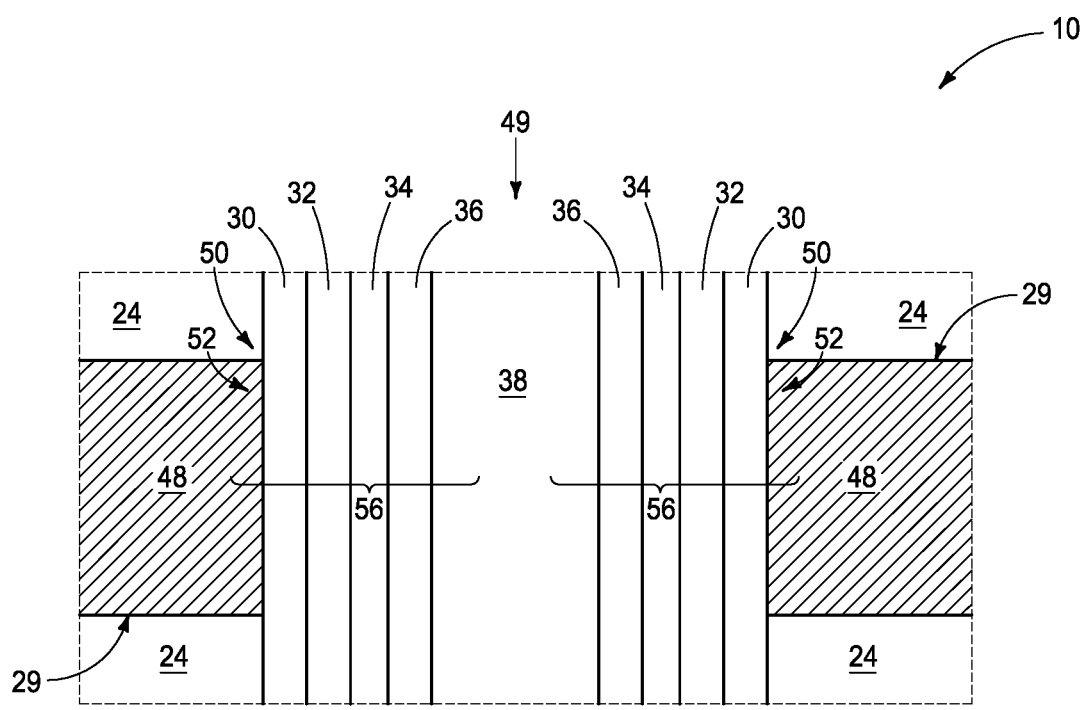
FIG. 11A is an enlarged view of a portion of the substrate as shown in FIG. 11.

Referring to FIGS. 10, 11, and 11a, control-gate material 48 has been removed from individual trenches 40. Such has resulted in formation of wordlines 29 and elevationally-extending strings 49 of individual transistors and/or memory cells 56. In one embodiment and as shown, strings 49 are formed to be vertical or within 10° of vertical. Approximate locations of transistors and/or memory cells 56 are indicated with brackets in FIG. 11A and some with dashed outlines in FIGS. 10 and 11, with transistors and/or memory cells 56 being essentially ring-like or annular in the depicted example. Control-gate material 48 has terminal ends 50 (FIG. 11A) corresponding to control-gate regions 52 of individual transistors and/or memory cells 56. Control-gate regions 52 in the depicted embodiment comprise individual portions of individual wordlines 29.

A charge-blocking region (e.g., charge-blocking material 30) is between charge-storage material 32 and individual control-gate regions 52, A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48). Regardless, as an additional example, an interface of a charge-storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative charge-storage material (e.g., a silicon nitride material 32).

Figure 12:
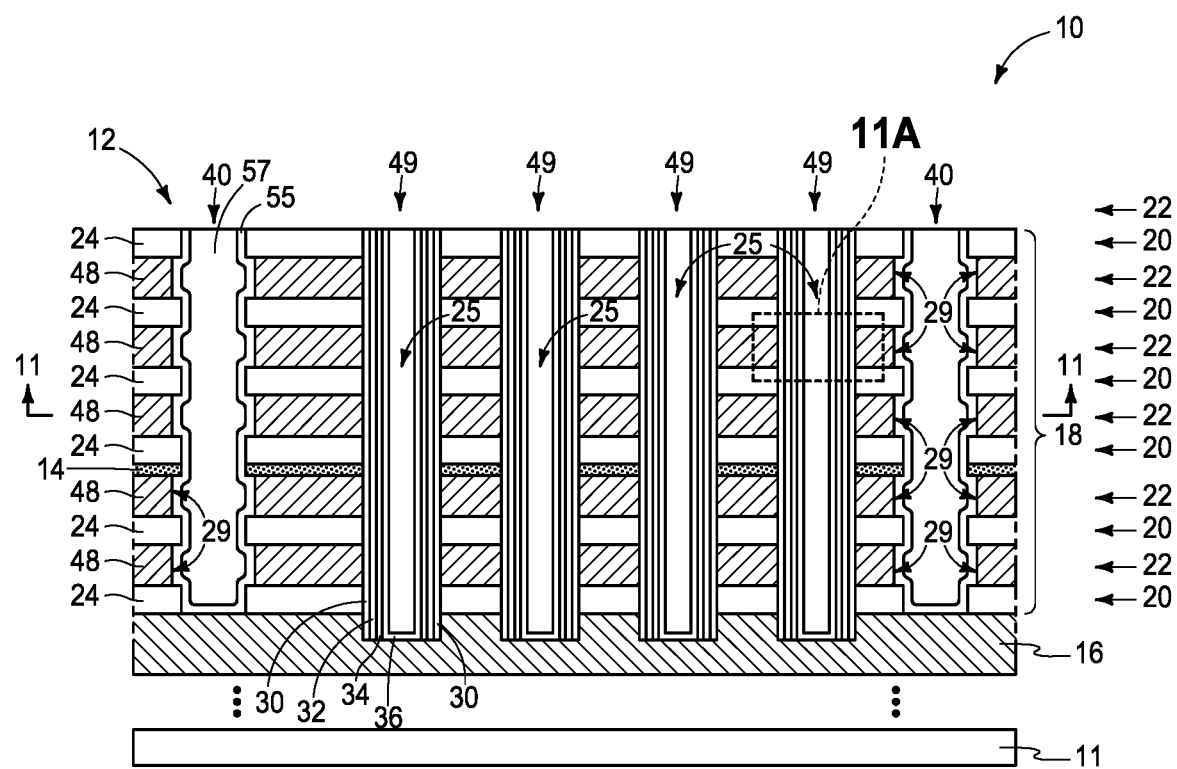
FIG. 12 is a view of the FIG. 11 substrate at a processing step subsequent to that shown by FIG. 11.

Referring to FIG. 12, an insulative-material lining 55 has been formed in individual trenches 40 over and elevationally along sidewalls of such trenches (e.g., silicon nitride, silicon oxynitride, aluminum oxide, hafnium oxide, combinations of these, etc.). Another material 57 (dielectric and/or silicon-containing such as polysilicon) has been formed in individual trenches 40 elevationally along and spanning laterally between insulative-material lining 55. Any other attribute(s) or aspect(s) as shown and/or described herein with respect to other embodiments may be used.

Figure 13:
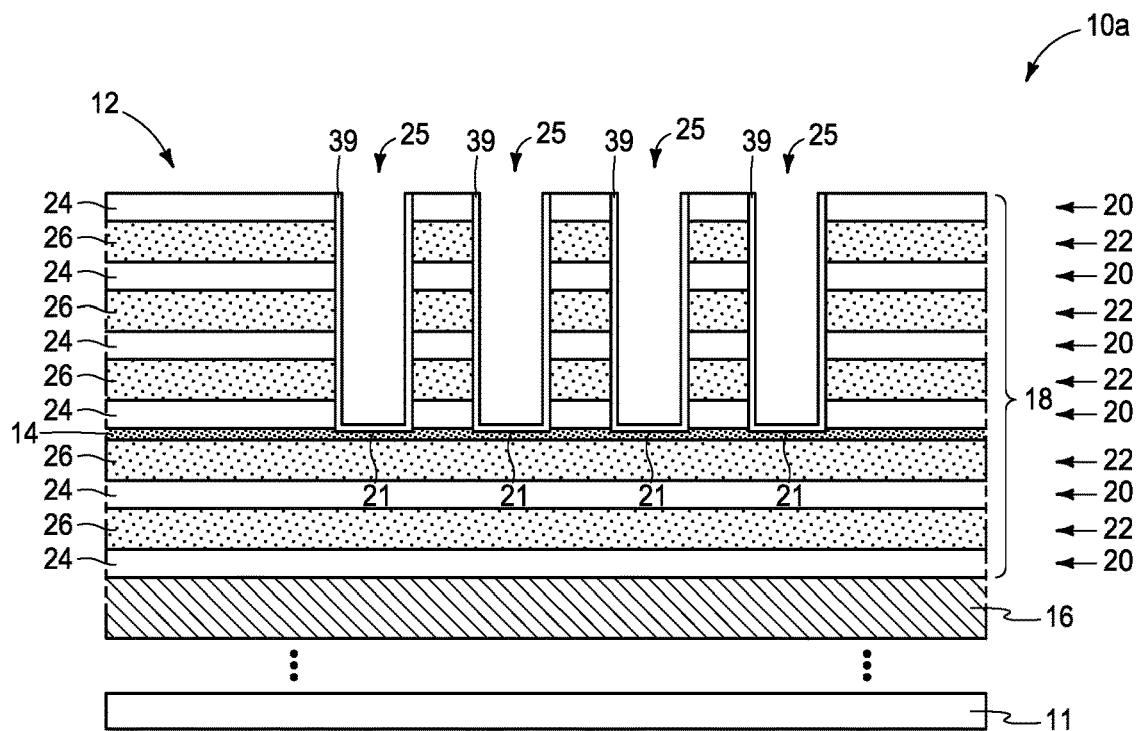
FIG. 13 is a diagrammatic cross-sectional view of a portion of a substrate in process in accordance with an embodiment of the invention.

An alternate example method embodiment in accordance with the invention is next described with reference to FIGS. 13-16 and a substrate construction 10a. Like numerals from the above-described embodiments have been used where appropriate, with some construction differences being indicated with suffix the "a" or with different numerals. Referring to FIG. 13, example processing is shown as would occur immediately subsequent to the example processing shown by FIG. 3. A liner 39 has been formed along sidewalls of individual channel openings 25 prior to and at least some of which will remain during the penetrating through etch-stop tier 14. In one embodiment and as shown, liner 39 has been formed across individual etch-stop tier bases 21.

Figure 14:
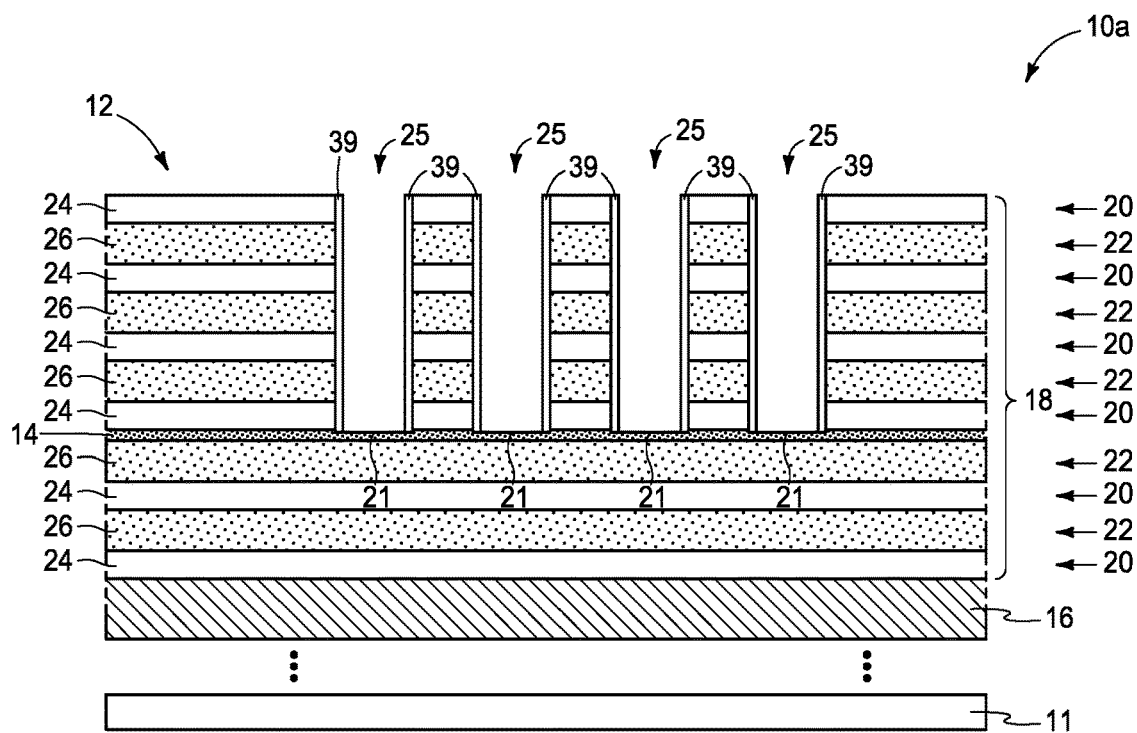
FIG. 14 is a view of the FIG. 13 substrate at a processing step subsequent to that shown by FIG. 13.

FIG. 14 shows subsequent processing where liner 39 has been removed from being across a central-portion of individual etch-stop tier bases 21 prior to penetrating through etch-stop tier 14, Such may occur, for example, by anisotropic etching of liner 39 to remove such from substantially being over horizontal surfaces.

Figure 15:
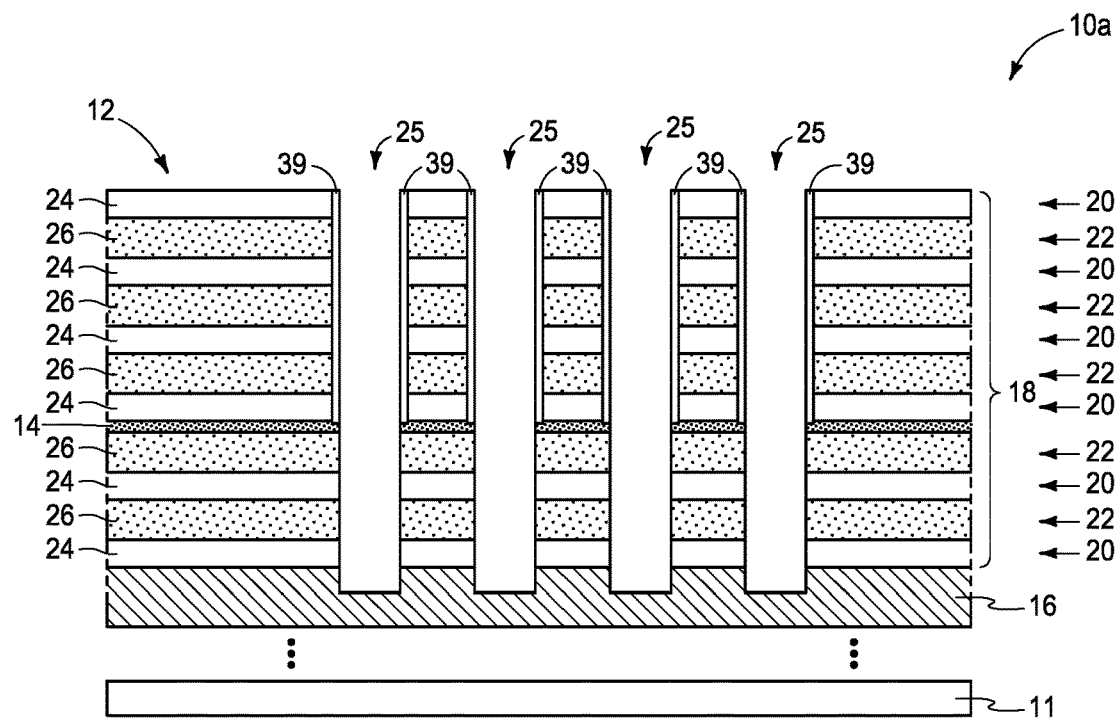
FIG. 15 is a view of the FIG. 14 substrate at a processing step subsequent to that shown by FIG. 14.

Referring to FIG. 15, etch-stop tier 14 has been penetrated through (e.g., by etching), wherein at least some of liner 39 has remained along sidewalls of individual channel openings 25 above etch-stop tier 14 during such act of penetrating. A purpose for including liner 39 may be to protect sidewalls of channel openings 25 above etch-stop tier 14 during etching through etch-stop tier 14, for example if etching chemistry to etch etch-stop tier 14 might damage or etch one of materials 24 and 26 of the sidewalls of channel openings 25. An example material for liner 39 is $Al_2O_3$. FIG. 15 also shows subsequent etching into and through insulative tiers 20 and wordline tiers 22 that are below etch-stop tier 14 to extend individual channel openings 25 deeper into stack 18 below etch-stop tier 14.

Figure 16:
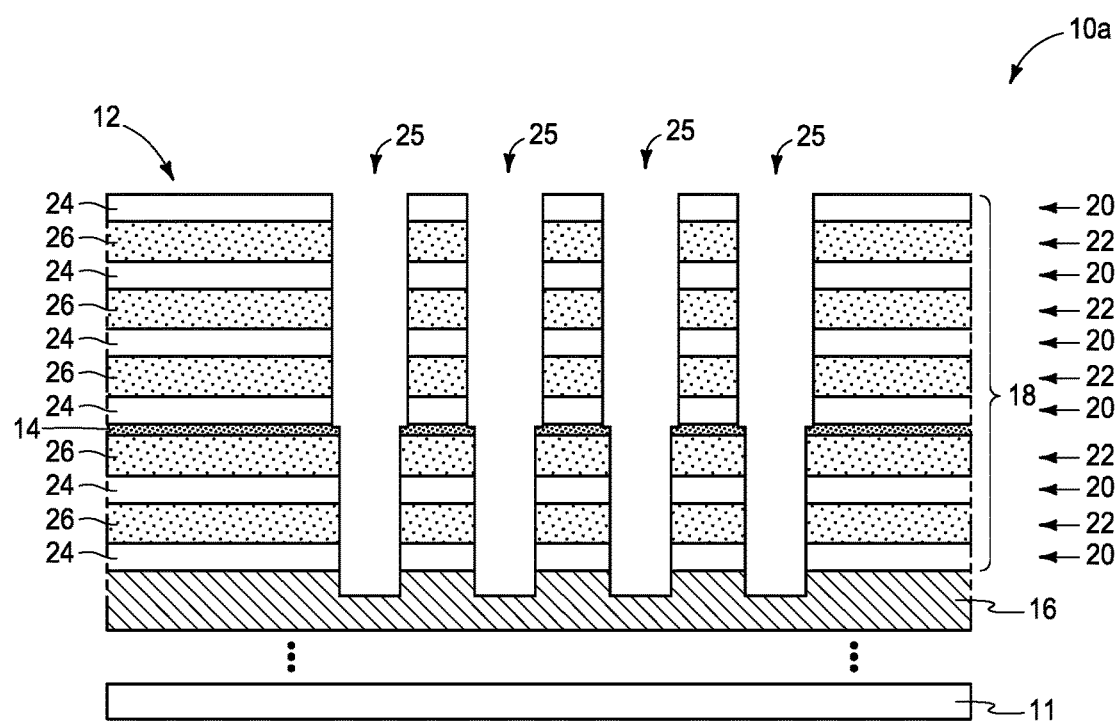
FIG. 16 is a view of the FIG. 15 substrate at a processing step subsequent to that shown by FIG. 15.

FIG. 16 shows removal of liners 39 (not shown), for example at the conclusion the FIG. 15 etch. Liners 39 may alternately be removed after penetrating through etch-stop tier 14 and before (not shown) etching into tiers 20, 22 there-below, or during the etching into insulative tiers 20 and wordline tiers 22 that are below etch-stop tier 14. Regardless, subsequent processing may occur as described and/or shown above. Any other attribute(s) or aspect(s) as shown and/or described herein with respect to other embodiments may be used.

Figure 17:
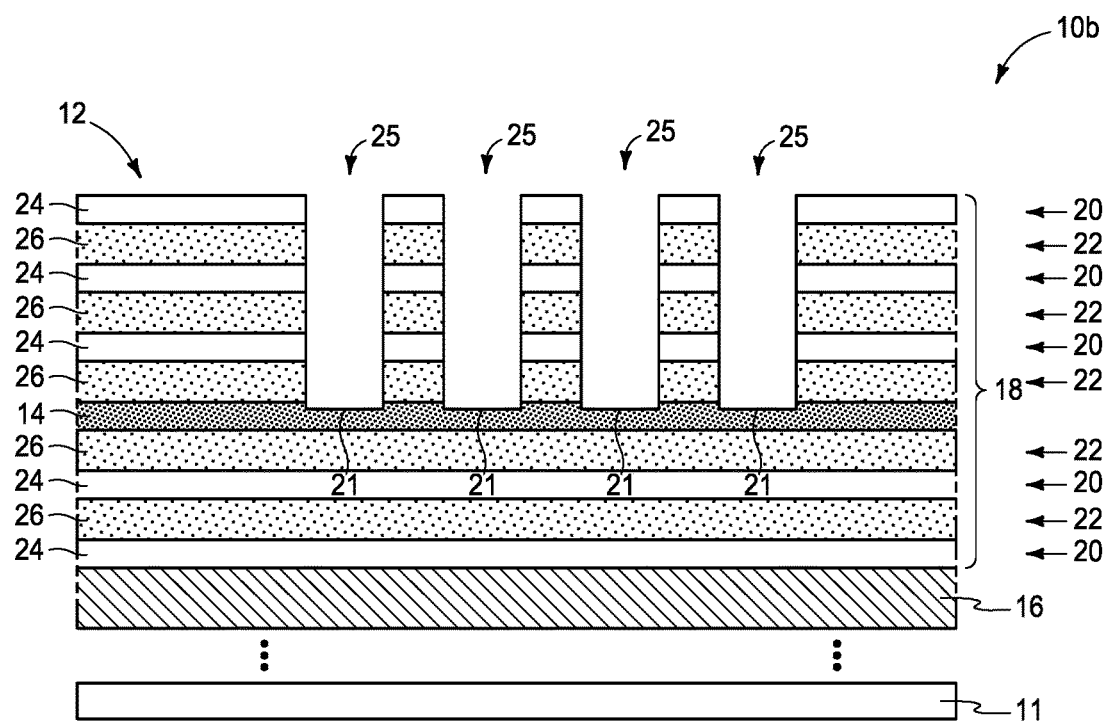
FIG. 17 is a diagrammatic cross-sectional view of a portion of a substrate in process in accordance with an embodiment of the invention.

Another example embodiment is next described with reference to FIGS. 17-21 with respect to a substrate construction 10b. Like numerals from the above-described embodiments have been used where appropriate, with some construction differences being indicated with the suffix "b" or with different numerals. FIG. 17 shows example processing as occurring through FIG. 3, yet with a thicker etch-stop tier 14 for clarity.

Figure 18:
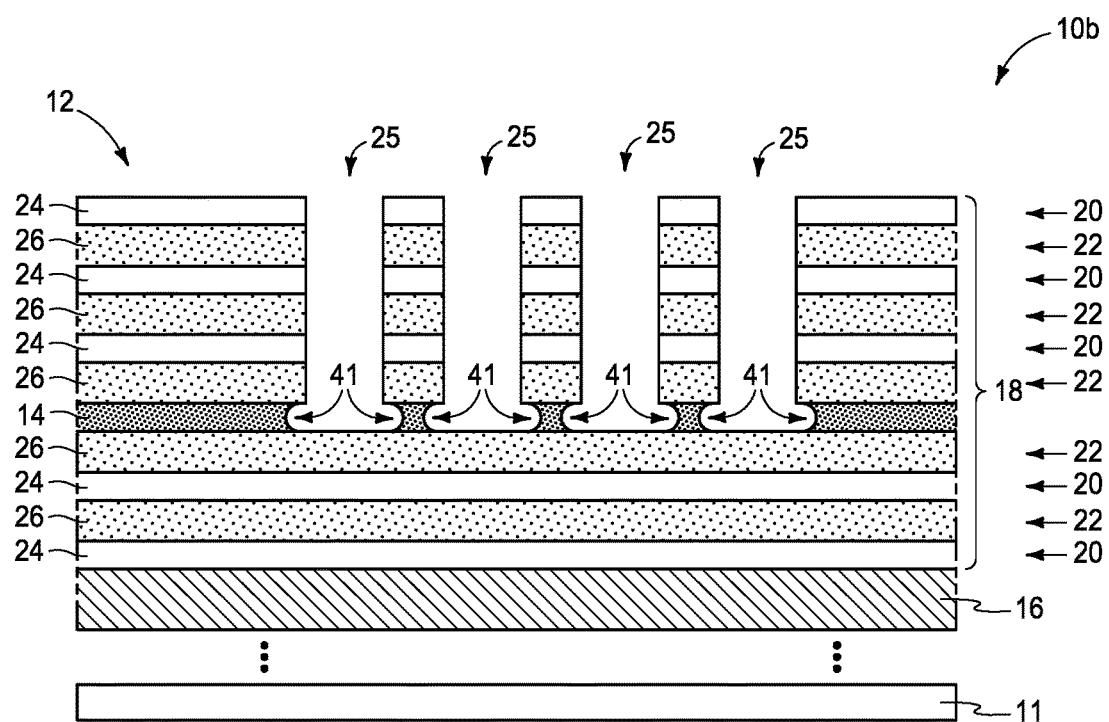
FIG. 18 is a view of the FIG. 17 substrate at a processing step subsequent to that shown by FIG. 17.

FIG. 18 shows subsequent processing whereby the penetrating through etch-stop tier 14 comprises etching that etches etch-stop tier 14 radially-outward relative to individual channel openings 25 to form an annular recess 41 that projects radially-outward relative to individual channel openings 25. Example such etching may occur by wet and/or dry isotropic etching (e.g., using $Cl_2$ and/or a mixture of a peroxide and ammonia for $Mg_xHf_yO_z$) to etch into and through etch-stop tier 14. Alternately, an anisotropic etch can initially be conducted to extend individual channel openings 25 partially or completely through etch-stop tier 14 producing substantially vertical-sidewalls within etch-stop tier 14, followed by substantially isotropic etching to form annular recesses 41. Regardless, such etching may be timed to preclude removing all material of etch-stop tier 14 from being between immediately-adjacent channel openings 25.

Figure 19:
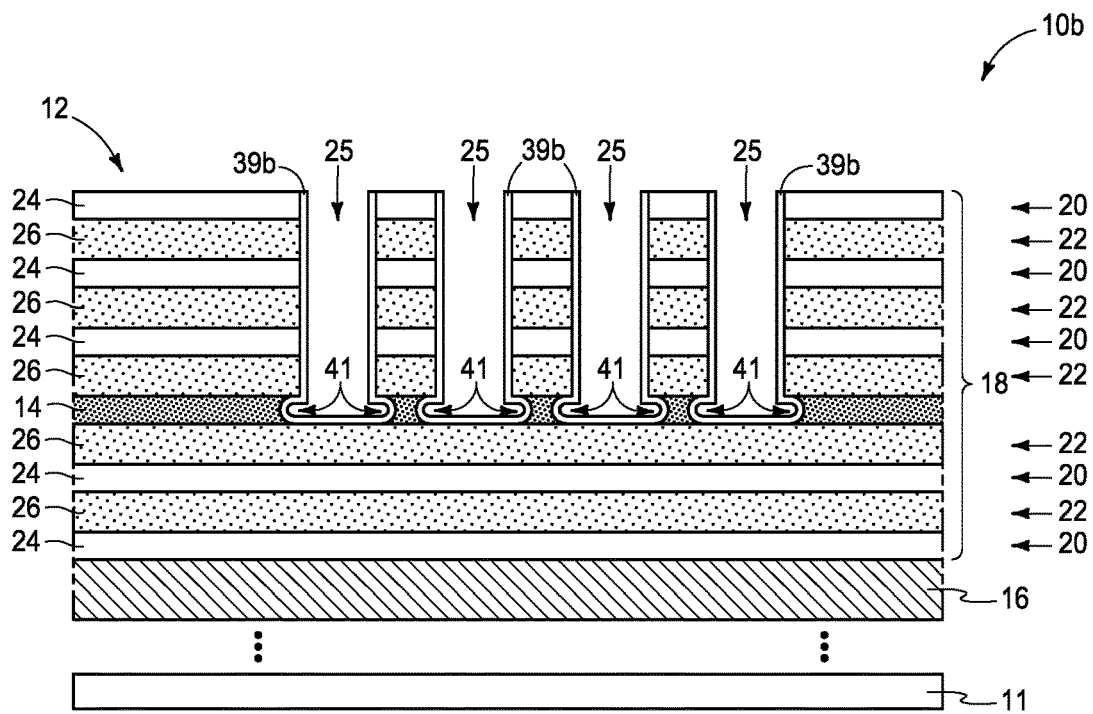
FIG. 19 is a view of the FIG. 18 substrate at a processing step subsequent to that shown by FIG. 18.

FIG. 19 shows subsequent processing wherein 39b is provided and received within annular recesses 41.

Figure 20:
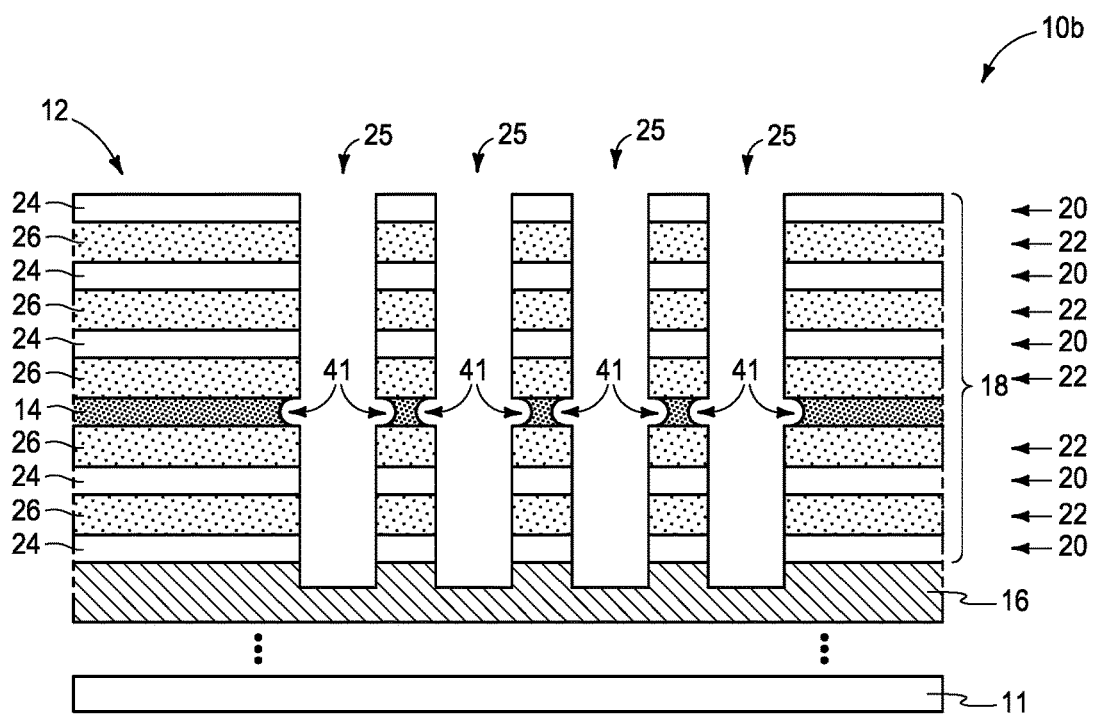
FIG. 20 is a view of the FIG. 19 substrate at a processing step subsequent to that shown by FIG. 19.

FIG. 20 shows subsequent processing wherein penetrating has occurred through central-portions of linings 39b (not shown), followed by removal of linings 39b, and followed by subsequent anisotropic etching of tiers 20, 22 below etch-stop tier 14 to extend channel openings 25 deeper into stack 18 as shown. Alternately, and by way of examples only, no lining 39b may be used (not shown) or such linings may be used and not removed (not shown) prior to etching into tiers 20, 22 below etch-stop tier 14.

Figure 21:
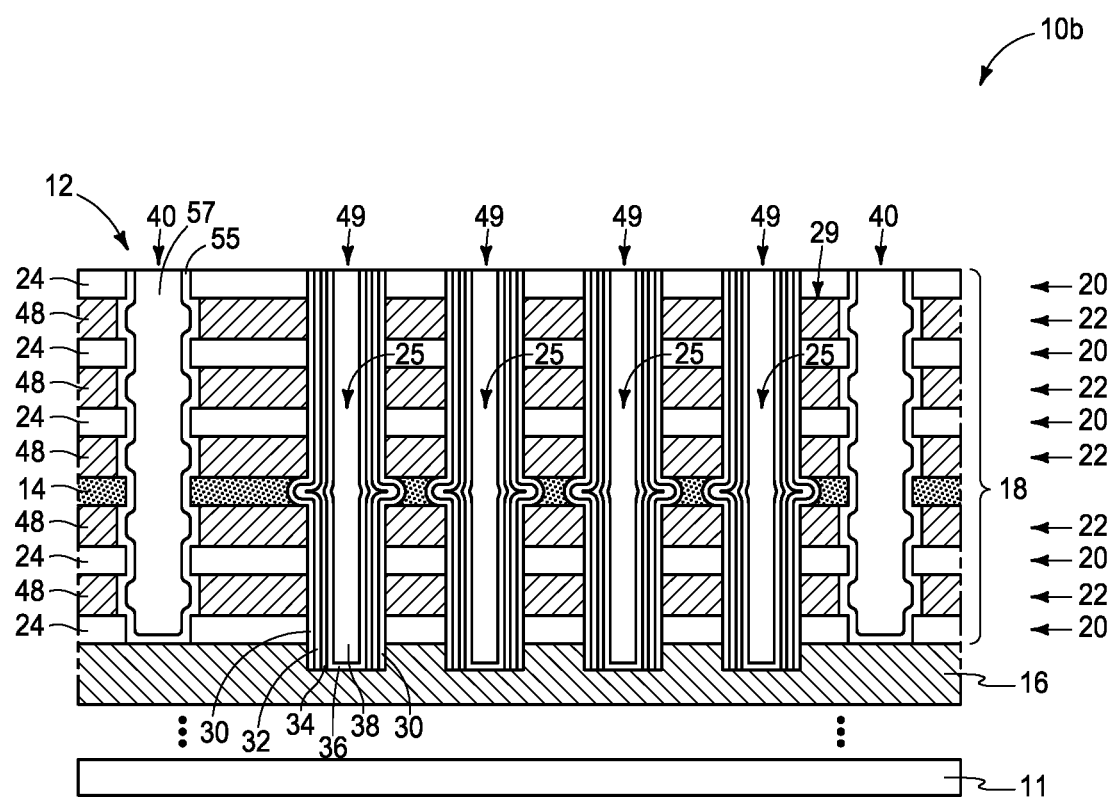
FIG. 21 is a view of the FIG. 20 substrate at a processing step subsequent to that shown by FIG. 20.

FIG. 21 shows subsequent processing analogous to that shown through FIG. 12 in the first-described embodiments wherein strings 49 and wordlines 29 have been formed. In one embodiment, such method comprises forming transistor charge-blocking material 30 within annular recesses 41, in one embodiment transistor charge-storage material 32 in annular recesses 41, and in one embodiment as shown both of materials 30 and 32 within annular recesses 41. Any other attribute(s) or aspect(s) as shown and/or described herein with respect to other embodiments may be used.

The above shown embodiments show an example of providing control-gate material 48 after forming transistor channel material 36. Further, in one such embodiment as stated above, the etch-stop tier may be one of wordline tiers 22 (not shown), with such a method further comprising replacing the etch-stop tier with the control-gate material after forming the transistor channel material.

Figure 22:
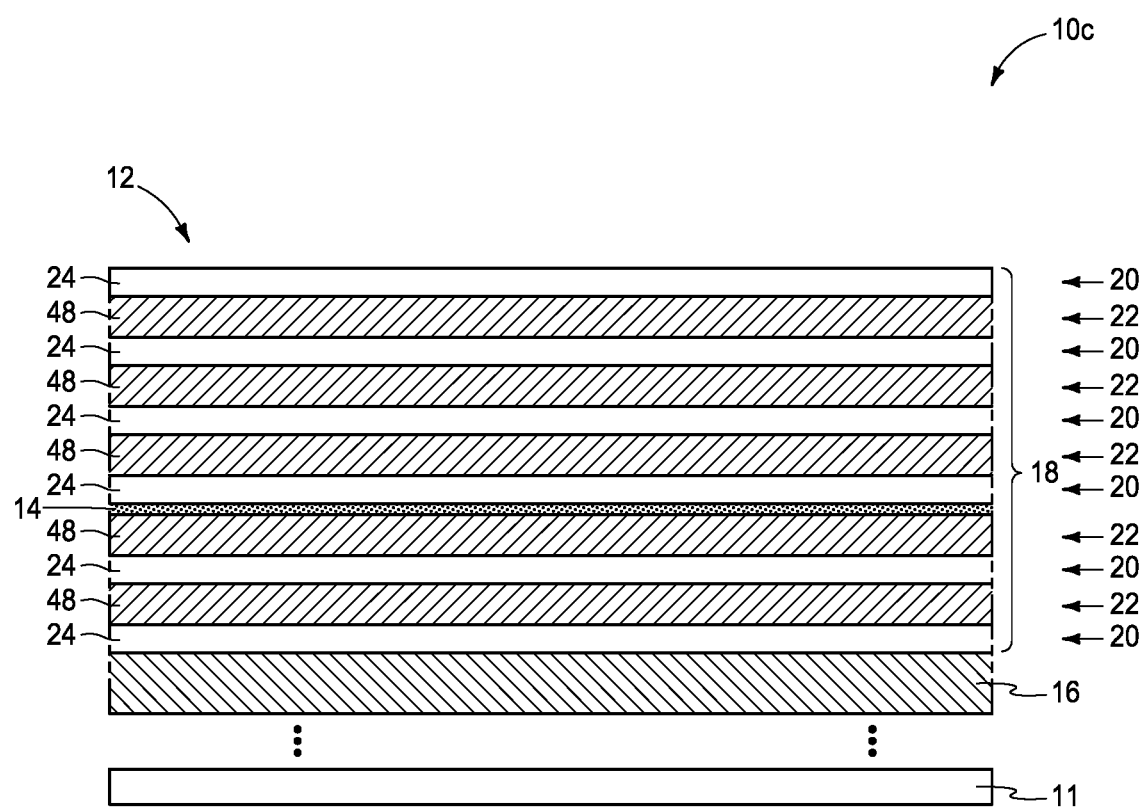
FIG. 22 is a diagrammatic cross-sectional view of a portion of a substrate in process in accordance with an embodiment of the invention.

Alternately, the control-gate material may be provided before forming the transistor channel material, for example using a substrate construction 10c as shown in FIG. 22. Like numerals from the above-described embodiments have been used where appropriate. FIG. 22 shows a starting-substrate construction 10c wherein starting-wordline tiers 22 in comparison to FIG. 1 comprise control-gate material 48 in lieu of material 26. Processing may otherwise subsequently occur as described above, by way of example. Any other attribute(s) or aspect(s) as shown and/or described herein with respect to other embodiments may be used.

Figure 23:
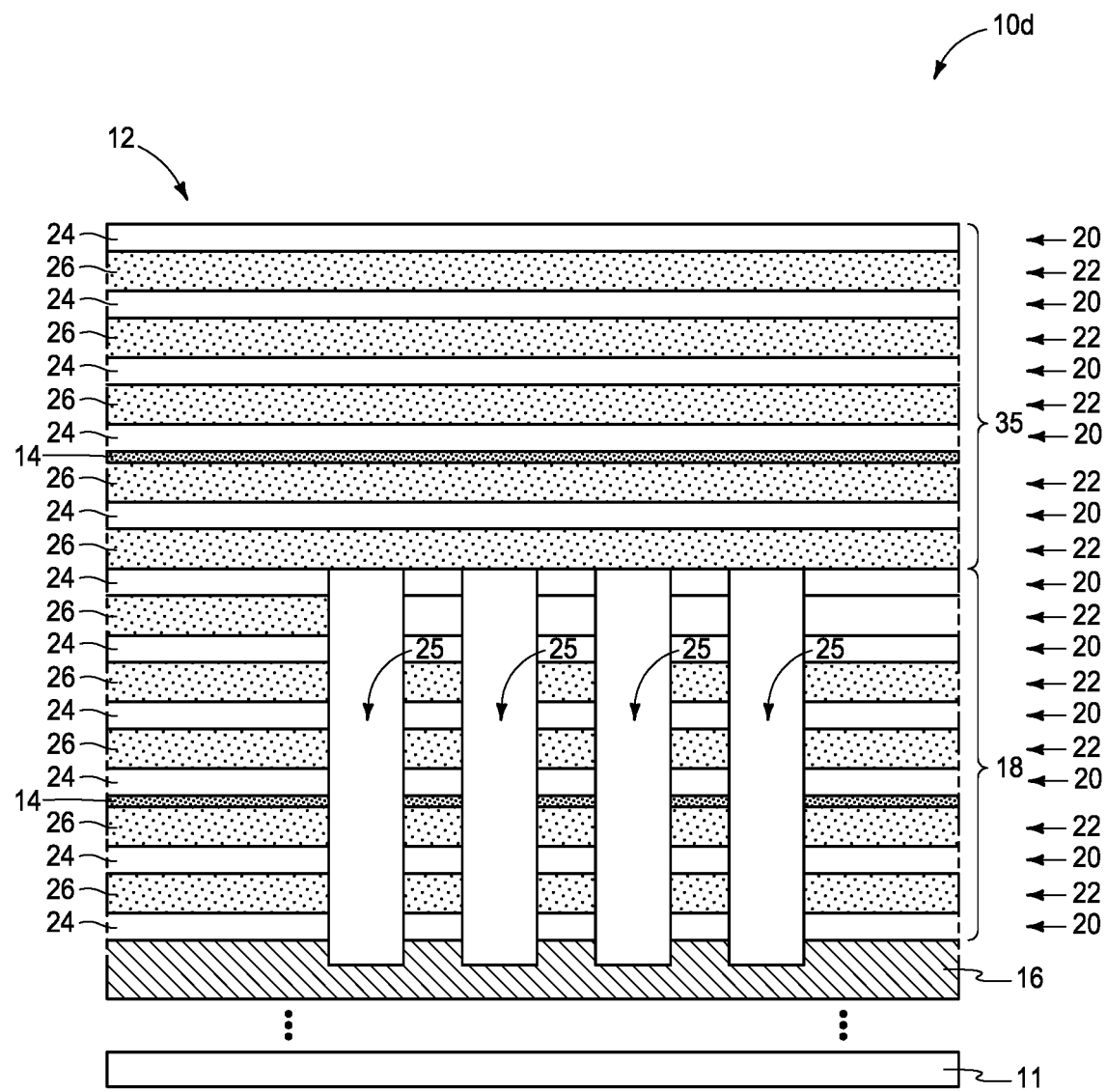
FIG. 23 is a diagrammatic cross-sectional view of a portion of a substrate in process in accordance with an embodiment of the invention.
Figure 24:
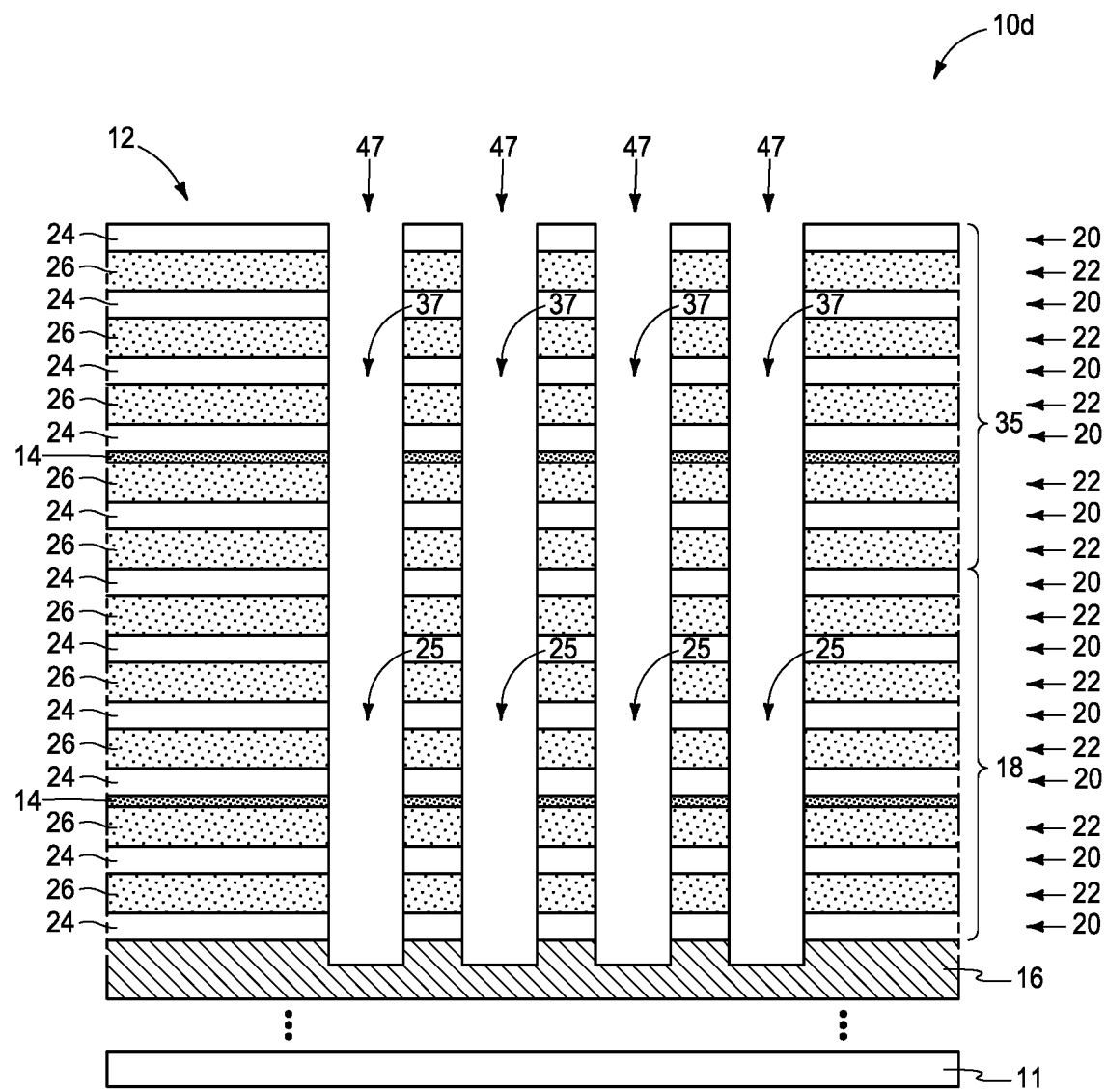
FIG. 24 is a view of the FIG. 23 substrate at a processing step subsequent to that shown by FIG. 23.

The above described and shown methods were with respect to forming an array of elevationally-extending strings of transistors and/or memory cells with respect to a single stack 18. Alternately, processing may occur with respect to multiple stacks that include at least an upper stack and a lower stack individually comprising vertically-alternating insulative tiers and wordline tiers, wherein at least one of the upper and lower stacks is processed as described above in accordance with at least one of such stacks having an etch-stop tier. Such an example method is described with respect to a substrate construction 10d as shown in FIGS. 23 and 24, Like numerals from the above-described embodiments have been used where appropriate, with some construction differences being indicated with the suffix "d" or with different numerals. FIG. 23 shows an upper stack 35 having been formed above previously-processed lower stack 18. Lower channel openings 25 have been formed in lower stack 18, for example as described above. One or more etch-stop tiers 14 may be used in lower stack 18, with only one etch-stop tier 14 being shown. Alternately, no etch-stop tier may be used in the lower stack and may be used in a stack above the lower stack.

FIG. 24 shows upper channel openings 37 as having been formed into upper stack 35 to individual of lower channel openings 25 to form interconnected channel openings 47 individually comprising one of individual lower channel openings 25 and one of individual upper channel openings 37.

At least one of upper stack 35 and lower stack 18 (both being shown) comprises an intra-stack ("intra" meaning within a stated stack where there are multiple stacks formed at different times) etch-stop tier 14 between a top tier and a bottom tier of the respective upper or lower stack, and that is of different composition from those of the insulative tiers and the wordline tiers of the respective upper or lower stack. The forming of at least one of all of lower channel openings 25 and all of upper channel openings 37 comprises etching into the insulative tiers and the wordline tiers that are above the intra-stack etch-stop tier to the intra-stack etch-stop tier to form the respective lower channel openings or upper channel openings to have individual bases comprising the intra-stack etch-stop tier (e.g., as described in any of the above embodiments). Penetrating has then been conducted through the intra-stack etch-stop tier to extend individual of the respective lower channel openings 25 or the upper channel openings 37 there-through. Then, etching is conducted into and through the insulative tiers and the wordline tiers that are below the intra-stack etch-stop tier to extend the respective individual upper or lower channel openings deeper into the respective upper or lower stack below the etch-stop tier. Transistor channel material would ultimately be formed in the individual upper and lower channel openings elevationally along the intra-stack etch-stop tier and along the insulative tiers and the wordline tiers that above and below the etch-stop tiers. Any other attribute(s) or aspect(s) as shown and/or described herein with respect to other embodiments may be used.

Embodiments of the invention encompass an array of elevationally-extending strings of memory cells independent of method of manufacture. Nevertheless, such an array may have any of the physical attributes described above with respect to method embodiments.

In one embodiment, such an array (e.g., 12) of elevationally-extending strings (e.g., 49) of memory cells (e.g., 56) comprises a vertical stack (e.g., 18 and/or 35) of alternating insulative tiers (e.g., 20) and wordline tiers (e.g., 22). A majority of the insulative tiers comprises silicon dioxide. At least one of the insulative tiers (e.g., 14) between a top tier and a bottom tier of the stack is of different composition from the majority insulative tiers. The at least one different composition insulative tier comprises an oxide comprising at least one of Mg and Hf. The wordline tiers have terminal ends (e.g., 50) corresponding to control-gate regions (e.g., 52) of individual memory cells. The control-gate regions individually comprise part of a wordline (e.g., 29) in individual of the wordline tiers.

A charge-blocking region (e.g., 30) of the individual memory cells extends elevationally along the individual control-gate regions. Charge-storage material (e.g., 32) of the individual memory cells extends elevationally along individual of the charge-blocking regions. Strings (e.g., 49) of channel material (e.g., 36) extend elevationally through the wordline tiers, the majority insulative tiers, and the at least one insulative tier comprising the oxide comprising at least one of Mg and Hf, insulative charge-passage material (e.g., 34) is laterally between the channel material and the charge-storage material. Any other attribute(s) or aspect(s) as shown and/or described herein with respect to other embodiments may be used.

An embodiment of the invention comprises an array (e.g., 12) of elevationally-extending strings (e.g., 49) of memory cells (e.g., 56). Such an array comprises a vertical stack (e.g., 18 and/or 35) of alternating insulative tiers (e.g., 20) and wordline tiers (e.g., 22). A majority of the insulative tiers comprises a first insulative composition (e.g., 24). At least one of the insulative tiers (e.g., 14) between a top tier and a bottom tier of the stack comprises a second insulative composition (e.g., material of etch-stop tier 14 that in this particular embodiment is insulative) that is different from the first insulative composition. The wordline tiers have terminal ends (e.g., 50) corresponding to control-gate regions (e.g., 52) of individual memory cells. The control-gate regions individually comprise part of a wordline (e.g., 29) in individual of the wordline tiers.

A charge-blocking region (e.g., 30) of the individual memory cells extends elevationally along the individual of control-gate regions. Charge-storage material (e.g., 32) of the individual memory cells extends elevationally along individual of the charge-blocking regions. Strings of channel material (e.g., 36) extend elevationally through the wordline tiers, the insulative tiers comprising the first insulative composition, and the least one insulative tier comprising the second insulative composition. Insulative charge-passage material (e.g., 34) is laterally between the channel material and the charge-storage material. The at least one insulative tier comprising the second insulative composition has an annular recess (e.g., 41) projecting radially outward relative to individual of the strings of the channel material. Some of the charge-storage material is within the annular recess. In one embodiment, the charge-blocking region comprises a charge-blocking material of different composition from that of the charge-storage material, and with some of the charge-blocking material being within the annular recess radially-outward of the charge-storage material. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, forming, and/or formation is such an act of one stated material relative to another stated material(s) so acted upon at a rate of at least 2:1 by volume.

Unless otherwise indicated, use of "or" herein encompasses either and both.

CONCLUSION

In some embodiments, a method used in forming an array of elevationally-extending strings of memory cells comprises forming a stack comprising vertically-alternating insulative tiers and wordline tiers. The stack comprises an etch-stop tier between a first tier and a second tier of the stack. The etch-stop tier is of different composition from those of the insulative tiers and the wordline tiers. Etching is conducted into the insulative tiers and the wordline tiers that are above the etch-stop tier to the etch-stop tier to form channel openings that have individual bases comprising the etch-stop tier. The etch-stop tier is penetrated through to extend individual of the channel openings there-through. After extending the individual channel openings through the etch-stop tier, etching is conducted into and through the insulative tiers and the wordline tiers that are below the etch-stop tier to extend the individual channel openings deeper into the stack below the etch-stop tier. Transistor channel material is formed in the individual channel openings elevationally along the etch-stop tier and along the insulative tiers and the wordline tiers that are above and below the etch-stop tier.

In some embodiments, a method used in forming an array of elevationally-extending strings of memory cells comprises forming upper and lower stacks individually comprising vertically-alternating insulative tiers and wordline tiers. Lower channel openings are formed in the lower stack. Upper channel openings are formed into the upper stack to individual of the lower channel openings to form interconnected channel openings individually comprising one of individual of the lower channel openings and one of individual of the upper channel openings. At least one of the upper and lower stacks comprises an intra-stack etch-stop tier between a top tier and a bottom tier of the respective upper or lower stack. The intra-stack etch-stop tier is of different composition from those of the insulative tiers and the wordline tiers of the respective upper or lower stack. The forming of at least one of all of the lower channel openings and all of the upper channel openings comprises etching into the insulative tiers and the wordline tiers that are above the intra-stack etch-stop tier to the intra-stack etch-stop tier to form the respective lower channel openings or the upper channel openings to have individual bases comprising the intra-stack etch-stop tier. The intra-stack etch-stop tier is penetrated through to extend individual of the respective lower channel openings or the upper channel openings there-through. After extending the individual channel openings through the intra-stack etch-stop tier, etching is conducted into and through the insulative tiers and the wordline tiers that are below the intra-stack etch-stop tier to extend the respective individual upper or lower channel openings deeper into the respective upper or lower stack below the intra-stack etch-stop tier. Transistor channel material is formed in the individual upper and lower channel openings elevationally along the intra-stack etch-stop tier and along the insulative tiers and the wordline tiers that are above and below the intra-stack etch-stop tier.

In some embodiments, an array of elevationally-extending strings of memory cells comprises a vertical stack of alternating insulative tiers and wordline tiers. A majority of the insulative tiers comprises silicon dioxide. At least one of the insulative tiers between a top tier and a bottom tier of the stack is of different composition from the majority insulative tiers. The at least one different composition insulative tier comprises an oxide comprising at least one of Mg and Hf. The wordline tiers have terminal ends corresponding to control-gate regions of individual memory cells. The control-gate regions individually comprise part of a wordline in individual of the wordline tiers. A charge-blocking region of the individual memory cells extends elevationally along the individual control-gate regions. Charge-storage material of the individual memory cells extends elevationally along individual of the charge-blocking regions. Strings of channel material extend elevationally through the wordline tiers, the majority insulative tiers, and the at least one insulative tier comprising the oxide comprising at least one of Mg and Hf. Insulative charge-passage material is laterally between the channel material and the charge-storage material.

In some embodiments, an array of elevationally-extending strings of memory cells comprises a vertical stack of alternating insulative tiers and wordline tiers. A majority of the insulative tiers comprises a first insulative composition. At least one of the insulative tiers between a top tier and a bottom tier of the stack comprises a second insulative composition that is different from the first insulative composition. The wordline tiers have terminal ends corresponding to control-gate regions of individual memory cells. The control-gate regions individually comprise part of a wordline in individual of the wordline tiers. A charge-blocking region of the individual memory cells extends elevationally along the individual control-gate regions. Charge-storage material of the individual memory cells extends elevationally along individual of the charge-blocking regions. Strings of channel material extend elevationally through the wordline tiers, the insulative tiers comprising the first insulative composition, and the at least one insulative tier comprising the second insulative composition. Insulative charge-passage material is laterally between the channel material and the charge-storage material. The at least one insulative tier comprising the second insulative composition has an annular recess projecting radially-outward relative to individual of the strings of the channel material. Some of the charge-storage material is within the annular recess.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of elevationally-extending strings of memory cells, comprising:
   a vertical stack comprising a top tier and a bottom tier, the vertical stack comprising alternating insulative tiers and wordline tiers between the top tier and the bottom tier, a majority of the insulative tiers comprising silicon dioxide, at least one of the insulative tiers that is between the top tier and the bottom tier being of different composition from the majority insulative tiers, the at least one different composition insulative tier comprising an oxide comprising at least one of Mg and Hf, the wordline tiers having terminal ends corresponding to control-gate regions of individual memory cells, the control-gate regions individually comprising part of a wordline in individual of the wordline tiers;
   a charge-blocking region of the individual memory cells extending elevationally along the individual control-gate regions;
   charge-storage material of the individual memory cells extending elevationally along individual of the charge-blocking regions;
   strings of channel material extending elevationally through the wordline tiers, the majority insulative tiers, and the at least one insulative tier comprising the oxide comprising at least one of Mg and Hf; and
   insulative charge-passage material laterally between the channel material and the charge-storage material.

2. The array of claim 1 wherein the oxide comprises Mg.

3. The array of claim 1 wherein the oxide comprises Hf.

4. The array of claim 1 wherein the oxide comprises Mg and Hf.

5. The array of claim 1 wherein the oxide comprises Al.

6. The array of claim 1 wherein the oxide comprises Si.

7. The array of claim 1 wherein the oxide comprises Al and Mg.

8. The array of claim 1 wherein the oxide comprises Al and Hf.

9. The array of claim 1 wherein the oxide comprises Al, Mg, and Hf.

10. The array of claim 1 wherein the oxide comprises Si and Mg.

11. The array of claim 1 wherein the oxide comprises Si and Hf.

12. The array of claim 1 wherein the oxide comprises Si, Mg, and Hf.

13. The array of claim 1 wherein the oxide comprises Si, Al, and Mg.

14. The array of claim 1 wherein the oxide comprises Si, Al, and Hf.

15. The array of claim 1 wherein the oxide comprises Si, Al, Mg, and Hf.

16. An array of elevationally-extending strings of memory cells, comprising:
   a vertical stack comprising a top tier and a bottom tier, the vertical stack comprising alternating insulative tiers and wordline tiers between the top tier and the bottom tier, a majority of the insulative tiers comprising a first insulative composition, at least one of the insulative tiers that is between the top tier and the bottom tier comprising a second insulative composition that is different from the first insulative composition, the second insulative composition comprising an oxide comprising at least one of Mg and Hf, the wordline tiers having terminal ends corresponding to control-gate regions of individual memory cells, the control-gate regions individually comprising part of a wordline in individual of the wordline tiers;
   a charge-blocking region of the individual memory cells extending elevationally along the individual control-gate regions;
   charge-storage material of the individual memory cells extending elevationally along individual of the charge-blocking regions;
   strings of channel material extending elevationally through the wordline tiers, the insulative tiers comprising the first insulative composition, and the at least one insulative tier comprising the second insulative composition;

insulative charge-passage material laterally between the channel material and the charge-storage material; and the at least one insulative tier comprising the second insulative composition having an annular recess projecting radially-outward relative to individual of the strings of the channel material, some of the charge-storage material being within the annular recess.

17. The array of claim 16 wherein the first insulative composition comprises silicon dioxide.

18. The array of claim 16 wherein the charge-blocking region comprises a charge-blocking material of different composition from that of the charge-storage material, some of the charge-blocking material being within the annular recess radially-outward of the charge-storage material.

19. The array of claim 16 wherein the oxide comprises Al and Mg.

20. The array of claim 16 wherein the oxide comprises Al and Hf.

21. The array of claim 16 wherein the oxide comprises Al, Mg, and Hf.

22. The array of claim 16 wherein the oxide comprises Si and Mg.

23. The array of claim 16 wherein the oxide comprises Si and Hf.

24. The array of claim 16 wherein the oxide comprises Si, Mg, and Hf.

25. The array of claim 16 wherein the oxide comprises Si, Al, and Mg.

26. The array of claim 16 wherein the oxide comprises Si, Al, and Hf.

27. The array of claim 16 wherein the oxide comprises Si, Al, Mg, and Hf.

* * * * *